United States Patent
Lee et al.

(10) Patent No.: US 8,427,246 B2
(45) Date of Patent: Apr. 23, 2013

(54) OSCILLATORS AND METHODS OF MANUFACTURING AND OPERATING THE SAME

(75) Inventors: Sung-chul Lee, Osan-si (KR); Sun-ae Seo, Hwaseong-si (KR); Ung-hwan Pi, Seoul (KR); Kee-won Kim, Suwon-si (KR); Kwang-seok Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/929,932

(22) Filed: Feb. 25, 2011

(65) Prior Publication Data
US 2012/0068779 A1  Mar. 22, 2012

(30) Foreign Application Priority Data
Sep. 16, 2010  (KR) .................. 10-2010-0091103

(51) Int. Cl.
*H01L 29/00* (2006.01)

(52) U.S. Cl.
USPC .................. 331/94.1; 331/108 C; 257/422

(58) Field of Classification Search ............. 331/108 C, 331/154, 94.1
See application file for complete search history.

(56) References Cited

U.S. PATENT DOCUMENTS

| | | | |
|---|---|---|---|
| 6,560,077 B2 | 5/2003 | Fujiwara et al. |
| 7,054,119 B2 | 5/2006 | Sharma et al. |
| 7,057,921 B2 | 6/2006 | Valet |
| 7,088,609 B2 | 8/2006 | Valet |
| 7,161,829 B2 | 1/2007 | Huai et al. |
| 7,440,314 B2 | 10/2008 | Sakimura et al. |
| 7,466,526 B2 | 12/2008 | Sato et al. |
| 7,504,898 B2 | 3/2009 | Fukuzawa et al. |
| 7,589,600 B2 | 9/2009 | Dimitrov et al. |
| 7,610,674 B2 | 11/2009 | Zhang et al. |
| 7,616,412 B2 | 11/2009 | Zhu et al. |

(Continued)

FOREIGN PATENT DOCUMENTS

| | | |
|---|---|---|
| JP | 2006-319259 | 11/2006 |
| JP | 2009-277704 | 11/2006 |

(Continued)

OTHER PUBLICATIONS

Yoshida, et al.; "Unipolar resistive switching in CoFeB/MgO/CoFeB magnetic tunnel junction," *Applied Physics Letters*, vol. 92, pp. 113508-1-113508-3 (2008).

(Continued)

*Primary Examiner* — Joseph Chang
(74) *Attorney, Agent, or Firm* — Harness, Dickey & Pierce, P.L.C.

(57) ABSTRACT

Oscillators and methods of manufacturing and operating the same are provided, the oscillators include a pinned layer, a free layer and a barrier layer having at least one filament between the pinned layer and the free layer. The pinned layer may have a fixed magnetization direction. The free layer corresponding to the pinned layer. The at least one filament in the barrier layer may be formed by applying a voltage between the pinned layer and the free layer. The oscillators may be operated by inducing precession of a magnetic moment of at least one region of the free layer that corresponds to the at least one filament, and detecting a resistance change of the oscillator due to the precession.

24 Claims, 6 Drawing Sheets

U.S. PATENT DOCUMENTS

| | | | |
|---|---|---|---|
| 7,732,881 B2 * | 6/2010 | Wang | 257/421 |
| 7,764,538 B2 | 7/2010 | Ito | |
| 7,965,474 B2 | 6/2011 | Sato et al. | |
| 7,994,865 B1 | 8/2011 | Manstretta et al. | |
| 2002/0054461 A1 | 5/2002 | Fujiwara et al. | |
| 2004/0257717 A1 | 12/2004 | Sharma et al. | |
| 2005/0063222 A1 | 3/2005 | Huai et al. | |
| 2005/0254286 A1 | 11/2005 | Valet | |
| 2005/0254287 A1 | 11/2005 | Valet | |
| 2006/0256484 A1 | 11/2006 | Sato et al. | |
| 2007/0047294 A1 | 3/2007 | Panchula | |
| 2007/0109147 A1 | 5/2007 | Fukuzawa et al. | |
| 2007/0188936 A1 | 8/2007 | Zhang et al. | |
| 2007/0259209 A1 | 11/2007 | Slavin et al. | |
| 2008/0019040 A1 | 1/2008 | Zhu et al. | |
| 2008/0074806 A1 | 3/2008 | Sato et al. | |
| 2008/0150640 A1 | 6/2008 | Dimitrov et al. | |
| 2008/0150643 A1 | 6/2008 | Suzuki et al. | |
| 2008/0241597 A1 | 10/2008 | Dieny et al. | |
| 2009/0050991 A1 | 2/2009 | Nagai et al. | |
| 2009/0080106 A1 | 3/2009 | Shimizu et al. | |
| 2009/0097169 A1 | 4/2009 | Sato et al. | |
| 2009/0097170 A1 | 4/2009 | Sato et al. | |
| 2009/0168501 A1 | 7/2009 | Ito | |
| 2009/0201614 A1 | 8/2009 | Kudo et al. | |
| 2009/0244792 A1 | 10/2009 | Nakayama et al. | |
| 2009/0302953 A1 | 12/2009 | Xi et al. | |
| 2009/0303779 A1 | 12/2009 | Chen et al. | |
| 2010/0039105 A1 | 2/2010 | Ryan et al. | |
| 2010/0039181 A1 | 2/2010 | Firastrau et al. | |
| 2010/0103730 A1 | 4/2010 | Shin | |
| 2010/0308923 A1 | 12/2010 | Kaka | |
| 2011/0260270 A1 | 10/2011 | Zhang et al. | |
| 2011/0280340 A1 | 11/2011 | Pasanen et al. | |
| 2012/0038428 A1 | 2/2012 | Lee et al. | |

FOREIGN PATENT DOCUMENTS

| | | |
|---|---|---|
| JP | 2007-305629 | 11/2007 |
| JP | 2008-053915 | 3/2008 |
| JP | 2008-084879 | 4/2008 |
| JP | 2009-094226 | 4/2009 |
| JP | 2009-099741 | 5/2009 |
| JP | 2009-135471 | 6/2009 |
| KR | 2004-0055384 | 6/2004 |
| KR | 10-2009-0119253 | 11/2006 |
| KR | 10-0697779 | 3/2007 |
| KR | 10-0827497 | 4/2008 |
| KR | 10-0866973 | 11/2008 |
| KR | 2009-0011247 | 2/2009 |
| KR | 2009-0031819 | 3/2009 |
| KR | 2009-0044575 | 5/2009 |
| KR | 2009-0071404 | 7/2009 |
| KR | 10-2009-0087825 | 8/2009 |
| KR | 2009-0102676 | 9/2009 |

OTHER PUBLICATIONS

Houssameddine, et al.; "Spin transfer induced coherent microwave emission with large power from nanoscale MgO tunnel junctions," *Applied Physics Letters*, vol. 93, pp. 022505-1-022505-3 (2008).

Dimitrov, et al.; "Dielectric breakdown of MgO magnetic tunnel junctions," *Applied Physics Letters*, vol. 94, pp. 123110-1-113110-3 (Mar. 26, 2009).

Kiselev, et al.; "Microwave oscillations of a nanomagnet driven by a spin-polarized current," *Nature*, vol. 425, pp. 380-383 (Sep. 25, 2003).

Kaka, et al., "Mutual phase-locking of microwave spin torque nano-oscillators," *Nature*, vol. 427, pp. 389-392 (Sep. 15, 2005).

Deac, et al., "Bias-driven high-power microwave emission from MgO-based tunnel magnetoresistance devices," *Nature Physics*, vol. 4, pp. 803-809 (Aug. 10, 2008).

Georges, et al., "Origin of the spectral linewidth in nonlinear spin-transfer oscillators based on MgO tunnel junctions," *Physical Review*, vol. 80, pp. 060404-1-060404-4 (Aug. 31, 2009).

Rippard, et al., "Direct-Current Induced Dynamics in $Co_{90}Fe_{10}$/$Ni_{80}Fe_{20}$ Point Contacts," *Physical Review Letters*, vol. 92, No. 2, pp. 027201-1-027201-4 (Jan. 16, 2004).

Office Action for corresponding U.S. Appl. No. 12/929,388 dated Mar. 28, 2012.

Office Action for corresponding U.S. Appl. No. 13/099,684 dated May 3, 2012.

Office Action dated Oct. 16, 2012 issued in related U.S. Appl. No. 13/064,627.

Office Action dated Aug. 22, 2012 issued in co-pending U.S. Appl. No. 13/099,684.

Kent, *A Nanomagnet Oscillator*, Nature Publishing Group, vol. 6, 11. 399-400 (Jun. 2007).

Office Action dated Aug. 22, 2012 for U.S. Appl. No. 13/099,684.

Office Action dated Sep. 5, 2012 for U.S. Appl. No. 13/096,627.

Office Action dated Jan. 10, 2013 issued in U.S. Appl. No. 13/174,932.

* cited by examiner

OSCILLATORS AND METHODS OF MANUFACTURING AND OPERATING THE SAME

CROSS-REFERENCE TO RELATED APPLICATION

This application claims the benefit of priority under 35 U.S.C. §119 from Korean Patent Application No. 10-2010-0091103, filed on Sep. 16, 2010, in the Korean Intellectual Property Office, the disclosure of which is incorporated herein by reference in its entirety.

BACKGROUND

1. Field

Example embodiments relate to oscillators and methods of manufacturing and operating the same.

2. Description of the Related Art

Oscillators are devices that generate signals having a regular cycle and are mainly used in wireless communication systems (e.g., mobile communication terminals, satellite/radar communication devices, wireless network devices, or automobile communication devices), as well as analog sound synthesizers. Mobile communication devices operate in specific frequency bands, and a voltage controlled oscillator (VCO) is used to generate a specific frequency band.

Essential characteristics of an oscillator include a quality factor, output power and phase noise. The higher the quality factor and output power and the lower the phase noise, the better the performance of the oscillator. Recently, because highly efficient and small communication devices are required and an operating frequency band has become high, small size and large output oscillators having high quality factor and lower phase noise are required.

A spin torque oscillator using a spin transfer torque has been recently introduced. The spin torque oscillator may be classified into a nanopillar structure and a point contact structure. The spin torque oscillator can be manufactured to be much smaller than a general inductor and capacitor (LC) oscillator and a film bulk acoustic resonator (FBAR) oscillator, and have a relatively high quality factor. Accordingly, the spin torque oscillator has drawn attention as a next generation oscillator. However, a general spin torque oscillator has low output power.

SUMMARY

Example embodiments relate to oscillators and methods of manufacturing and operating the same.

Provided are oscillators using a spin transfer torque and having high output power and low noise. Provided are methods of manufacturing the oscillators, and methods of operating the oscillators.

Additional aspects will be set forth in part in the description which follows and, in part, will be apparent from the description, or may be learned by practice of the presented embodiments.

According to example embodiments, an oscillator includes a pinned layer of which magnetization direction is fixed, a free layer corresponding to (or spaced apart from) the pinned layer, and a barrier layer interposed between the pinned layer and the free layer. The barrier layer includes at least one filament.

The pinned layer may have in-plane magnetic anisotropy and the free layer may have perpendicular magnetic anisotropy. Alternatively, the pinned layer may have perpendicular magnetic anisotropy and the free layer may have in-plane magnetic anisotropy.

The pinned layer and the free layer may have in-plane magnetic anisotropy.

The oscillator may further include a reference layer corresponding to (or spaced apart from) the free layer, and a separation layer interposed between the free layer and the reference layer. The reference layer may have in-plane magnetic anisotropy.

The barrier layer may have a thickness of about 10 nm or below.

The barrier layer may include a plurality of filaments.

According to example embodiments, a method of manufacturing an oscillator includes forming a stack structure including a pinned layer, a free layer and a barrier layer interposed between the pinned layer and the free layer, and forming at least one filament in the barrier layer by applying a voltage between the pinned layer and the free layer.

The pinned layer may have in-plane magnetic anisotropy, and the free layer may have perpendicular magnetic anisotropy. The pinned layer may have perpendicular magnetic anisotropy, and the free layer may have in-plane magnetic anisotropy.

The pinned layer and the free layer may have in-plane magnetic anisotropy.

The method may further include forming a reference layer corresponding to the free layer, and a separation layer interposed between the free layer and the reference layer. The reference layer may have in-plane magnetic anisotropy.

According to example embodiments, a method of operating an oscillator including a pinned layer, a free layer, and a barrier layer including at least one filament between the pinned layer and the free layer, includes inducing precession of a magnetic moment of at least one region of the free layer that corresponds to the at least one filament, and detecting a resistance change of the oscillator due to the precession.

The inducing of precession of the magnetic moment may include applying a current between the pinned layer and the free layer. The current may be applied so that electrons flow from the pinned layer to the free layer through the barrier layer.

The inducing of precession of the magnetic moment may further include applying a magnetic field to the free layer. The magnetic field may be applied in a direction parallel to a magnetization easy axis of the free layer.

The pinned layer may have in-plane magnetic anisotropy, and the free layer may have perpendicular magnetic anisotropy. The pinned layer may have perpendicular magnetic anisotropy, and the free layer may have in-plane magnetic anisotropy.

The pinned layer and the free layer may have in-plane magnetic anisotropy.

The oscillator may further include a reference layer corresponding to (or spaced apart from) the free layer, and a separation layer interposed between the free layer and the reference layer. The reference layer may have in-plane magnetic anisotropy.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
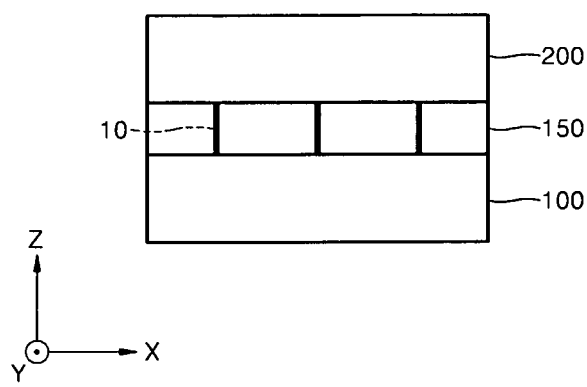
FIG. 1 is a cross-sectional view of an oscillator according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described, herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Hereinafter, oscillators and a method of manufacturing and operating the oscillator according to example embodiments will be described more fully with reference to the accompanying drawings.

Example embodiments relate to oscillators and methods of manufacturing and operating the same.

FIG. 1 is a cross-sectional view of an oscillator according to example embodiments.

Referring to FIG. 1, a pinned layer 100 and a free layer 200 may be spaced apart from each other, and a barrier layer 150 may be interposed between the pinned layer 100 and the free layer 200. The barrier layer 150 may include at least one filament 10. In FIG. 1, the barrier layer 150 includes three filaments 10. However, example embodiments are not limited thereto, and thus the number of filaments 10 may vary. Hereinafter, the elements mentioned above are described in detail.

The pinned layer 100 which has a magnetization direction fixed in a set direction may be formed of a ferromagnetic material including at least one of Co, Fe, Ni or combinations thereof, for example. The ferromagnetic material may further include other elements (e.g., boron (B), chromium (Cr), platinum (Pt), palladium (Pd) or combinations thereof) in addition to Co, Fe, and Ni. There are various methods for fixing a magnetization direction of the pinned layer 100. For example, in order to fix the magnetization direction of the pinned layer 100, a synthetic antiferromagnetic (SAF) structure (not illustrated) or an antiferromagnetic layer (not illustrated) may be used. Alternatively, the magnetization direction of the pinned layer 100 may be fixed to a set direction by increasing the thickness of the pinned layer 100, or by using shape anisotropy without using the SAF structure or the antiferromagnetic layer. That is, the magnetization direction of the pinned layer 100 may be fixed without using an additional layer.

The free layer 200 has a variable magnetization direction and may be formed of a general ferromagnetic material. The ferromagnetic material may include at least one of Co, Fe, Ni or combinations thereof and may further include other elements (e.g., B, Cr, Pt, Pd, similar elements or combinations thereof). The free layer 200 may be formed of the same material as the pinned layer 100, or may be formed of a different material than the pinned layer 100.

The barrier layer 150 may be formed of any insulating barrier material used in a magnetic tunnel junction (MTJ) structure. For example, the barrier layer 150 may include an insulation layer (dielectric layer) (e.g., Mg oxide or Al oxide). When these materials are used to form the barrier layer 150, a magnetoresistance (MR) ratio of the oscillator may increase so as to easily increase output power. According to example embodiments, a resistance change material used in a resistive random access memory (RRAM) may be used to form the barrier layer 150, in addition to the Mg oxide and the Al oxide. For example, a resistance change material (e.g., Ni oxide, Zr oxide, Ta oxide, Ti oxide, Cu oxide, Co oxide, Hf oxide, Zn oxide, W oxide, Nb oxide, TiNi oxide, LiNi oxide, InZn oxide, V oxide, SrZr oxide, SrTi oxide, Cr oxide or Fe oxide) may be used to form the barrier layer 150.

The barrier layer 150 may include at least one filament 10. The filament 10 may be formed by soft breakdown. The filament 10 is a current path connecting the pinned layer 100 to the free layer 200 and may function as a channel transmitting a spin torque from the pinned layer 100 to the free layer 200. Accordingly, precession of a magnetic moment may be induced in a region of the free layer 200 that corresponds to the filament 10. When a plurality of filaments 10 are provided, precession of a magnetic moment may be induced in a plurality of regions of the free layer 200. As such, when precession of a magnetic moment is simultaneously generated in the plurality of regions of the free layer 200, output power of the oscillator may increase.

Also, the filament 10 may reduce resistance of the barrier layer 150. That is, resistance multiplied by area "RA" of the barrier layer 150 may be reduced by the filament 10. As "RA" of the barrier layer 150 reduces, shot noise of the oscillator may be reduced. Accordingly, noise of the oscillator may be reduced by the filament 10. When a MTJ structure having a large MR ratio is used without the filament 10, output power may increase to a certain degree. However, in this case, noise also increases. In example embodiments, because the barrier layer 150 including the filaments 10 is used, it is possible to reduce noise of the oscillator and increase output power.

A thickness of the barrier layer 150 may be about 10 nm or smaller, for example, about 5 nm or below. When a thickness of the barrier layer 150 is excessively thick, it may be difficult to form the filament 10. Also, "RA" of the barrier layer 150 increases and thus noise may increase. Accordingly, a thickness of the barrier layer 150 may be about 10 nm or smaller.

As described above, in example embodiments, by applying the barrier layer 150 including at least one filament 10 between the pinned layer 100 and the free layer 200, it is possible to realize a spin torque oscillator having high output power and low noise. For example, the spin torque oscillator according to example embodiments may have high output power of about 1 μW or above.

Although not illustrated in FIG. 1, a first electrode may be disposed on the lower surface of the pinned layer 100 and a second electrode may be disposed on the upper surface of the free layer 200. The first and second electrodes may be optionally disposed according to materials used to form the pinned layer 100 and the free layer 200. For example, when electric resistance of the pinned layer 100 and the free layer 200 is sufficiently low, the pinned layer 100 and the free layer 200 may be used as electrodes and thus the first and second electrodes may not be needed.

In FIG. 1, the pinned layer 100 may have in-plane magnetic anisotropy or perpendicular magnetic anisotropy. The free layer 200 may also have in-plane magnetic anisotropy or perpendicular magnetic anisotropy. In other words, the pinned layer 100 may have a magnetization direction parallel to an XY plane or a magnetization direction parallel to a Z-axis. The free layer 200 may have a magnetization easy axis parallel to an XY plane, or a magnetization easy axis parallel to a Z-axis.

When the pinned layer 100 or the free layer 200 has perpendicular magnetic anisotropy, the pinned layer 100 or the free layer 200 may be an alloy layer formed of an alloy including Co (e.g., CoPt or CoCrPt), or may be a multi-layer. The multi-layer may, for example, include a layer including at least one selected from the group consisting of Co and an alloy including Co, and a layer including at least one selected from the group consisting of B, Cr, Pt, and Pd, are alternately stacked. When the pinned layer 100 or the free layer 200 has in-plane magnetic anisotropy, the pinned layer 100 or the free layer 200 may be a material layer including at least one selected from the group consisting of Co, Ni, and Fe (e.g., CoFeB or NiFe).

Figure 2:
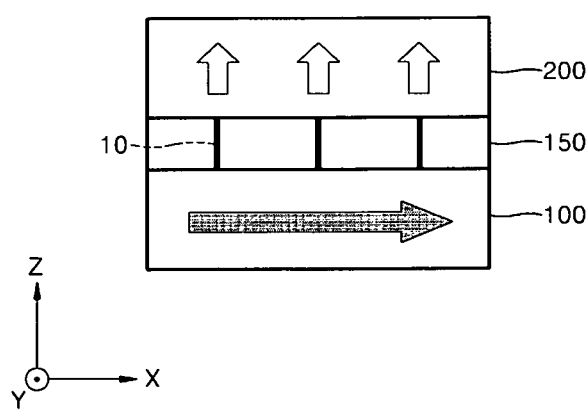
FIG. 2 is a cross-sectional view of the oscillator of FIG. 1 illustrating magnetization directions of a pinned layer and a free layer according to example embodiments.

FIG. 2 is a cross-sectional view of the oscillator of FIG. 1 illustrating the magnetization directions of the pinned layer 100 and the free layer 200 according to example embodiments.

Referring to FIG. 2, the pinned layer 100 has in-plane magnetic anisotropy, and the free layer 200 has the perpendicular magnetic anisotropy. For example, the pinned layer 100 may have a magnetization direction parallel to an X-axis and the free layer 200 may have a magnetization direction parallel to a Z-axis. The arrows illustrated in the pinned layer 100 and the free layer 200 indicate the magnetization directions thereof. In the other drawings, arrows illustrated in layers also indicate magnetization directions thereof.

Figure 3:
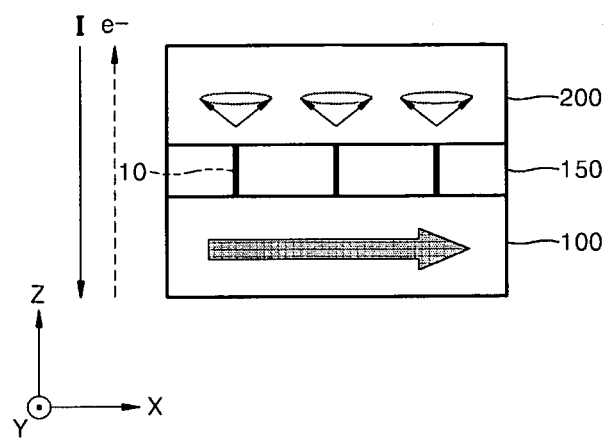
FIG. 3 is a cross-sectional view illustrating a method of operating the oscillator of FIG. 2.

FIG. 3 is a cross-sectional view illustrating a method of operating the oscillator of FIG. 2.

Figure 4:
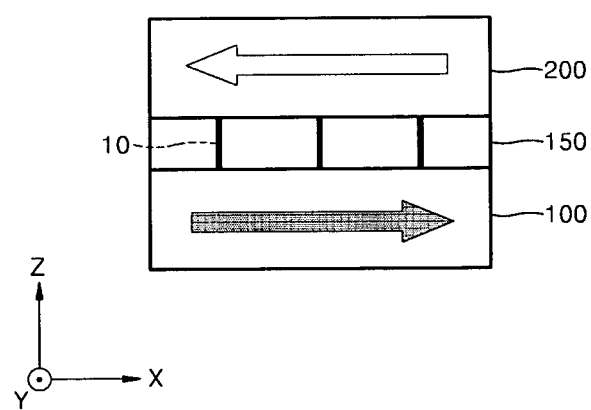
FIG. 4 is a cross-sectional view of the oscillator of FIG. 1 illustrating magnetization directions of a pinned layer and a free layer according to example embodiments.

Referring to FIG. 4, a current, I, may be applied to the oscillator so that precession of a magnetic moment of the free layer 200 may be induced. The current I may be applied from the free layer 200 to the pinned layer 100. Due to such a current I, electrons e− may flow from the pinned layer 100 to the free layer 200. The electrons e− flowing from the pinned layer 100 to the free layer 200 may have the same spin direction as the pinned layer 100 and may apply a spin torque to the free layer 200. The filament 10, which is a current path, may function as a channel transmitting the spin torque. Accordingly, the spin torque may be mainly transmitted to the region of the free layer 200 that corresponds to the filaments 10. Thus, a magnetic moment of the region of the free layer 200 that corresponds to the filament 10 may be precessed due to the spin torque. The precession of the magnetic moment denotes that an axis of the magnetic moment rotates in a specific orbit. The axis direction of the magnetic moment may be the same as the magnetization direction. Thus, the precession of the magnetic moment may correspond to a rotation of the magnetization direction. When a plurality of filaments 10 exist, magnetic moments may be simultaneously precessed in a plurality of regions of the free layer 200. Due to the precession of the magnetic moment, an electric resistance of the oscillator may be periodically changed and as a result, a signal in a specific frequency band may oscillate. The mechanism of the precession described above is an example and other principles may be further applied to the precession. Also, the orbit of the precession illustrated in FIG. 3 is only an example, and an orbit and direction of the precession may vary according to the intensity of the current I, for example.

Although not illustrated in FIG. 3, an external magnetic field may be further applied to the oscillator to operate the oscillator according to example embodiments. For example, an external magnetic field may be applied to the free layer 200 and a direction thereof may be a Z-axis direction. That is, the external magnetic field may be applied in a direction parallel to the magnetization easy axis direction of the free layer 200. A force, where the external magnetic field affects the magnetic moment of the free layer 200, and a force, where the spin torque due to the current I affects the magnetic moment of the free layer 200, may be simultaneously exerted so as to induce the precession.

In example embodiments, the magnetic moment may be precessed in the plurality of regions of the free layer 200 simultaneously and signals generated therefrom may be synchronized, thereby obtaining high output power. As the number of the filaments 10 increases, output power may significantly increase. Also, "RA" of the barrier layer 150 reduces due to the filaments 10 and thereby noise may be reduced.

FIG. 4 is a cross-sectional view of an oscillator illustrating magnetization directions of the pinned layer 100 and the free layer 200 according to other example embodiments.

Referring to FIG. 4, both the pinned layer 100 and the free layer 200 may have in-plane magnetic anisotropy. For example, a magnetization direction of the pinned layer 100 may be an X-axis direction and a magnetization direction of the free layer 200 may be an inverse direction of the X-axis direction.

Figure 5:
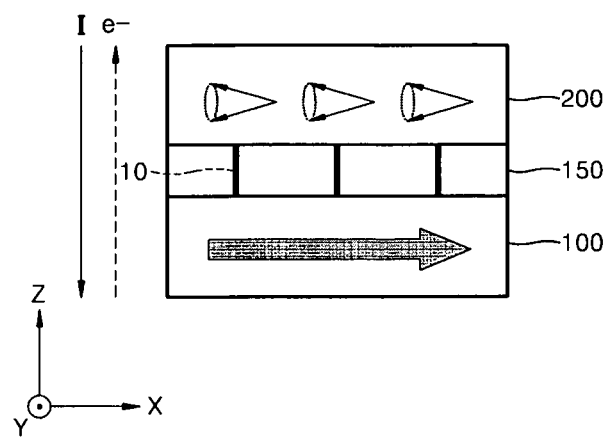
FIGS. 5 and 6 are cross-sectional views illustrating a method of operating the oscillator of FIG. 4.
Figure 6:
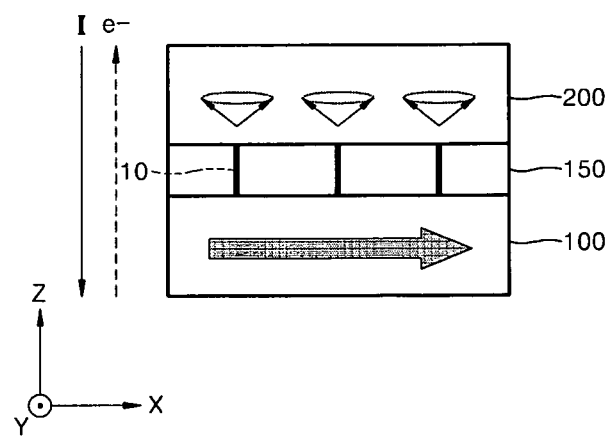

FIGS. 5 and 6 are cross-sectional views illustrating a method of operating the oscillator of FIG. 4.

Referring to FIG. 5, as a current I is applied to the oscillator, the magnetic moment of the free layer 200 may be precessed. The current I may be applied from the free layer 200 to the pinned layer 100. Electrons e− may flow from the pinned layer 100 to the free layer 200 due to the current I. The electrons e− flowing from the pinned layer 100 to the free layer 200 through the filaments 10 may have the same spin direction as the pinned layer 100 and may apply a spin torque to the free layer 200. Accordingly, the magnetic moment of the regions of the free layer 200 that correspond to the filaments 10 may be precessed.

In FIG. 5, a stray field (not illustrated) may be applied from the pinned layer 100 to the free layer 200, wherein the stray field may function similarly to the external magnetic field. That is, a force that the stray field affects the free layer 200 may be balanced with a force that the spin torque affects the free layer 200 due to the current I, and thus the precession may be induced. Accordingly, in this case, an additional external magnetic field may not be applied. However, in some cases, an external magnetic field may be further applied to the oscillator. Here, the external magnetic field may be applied in a direction parallel to the magnetization easy axis of the free layer 200, for example, an inverse direction of an X-axis.

The orbit of the precession of the magnetic moment illustrated in the free layer 200 of FIG. 5 is only an example and an orbit and direction of the precession may vary according to the intensity of the current I. For example, the orbit of the precession of the magnetic moment in the free layer 200 may be changed as illustrated in FIG. 6.

Figure 7:
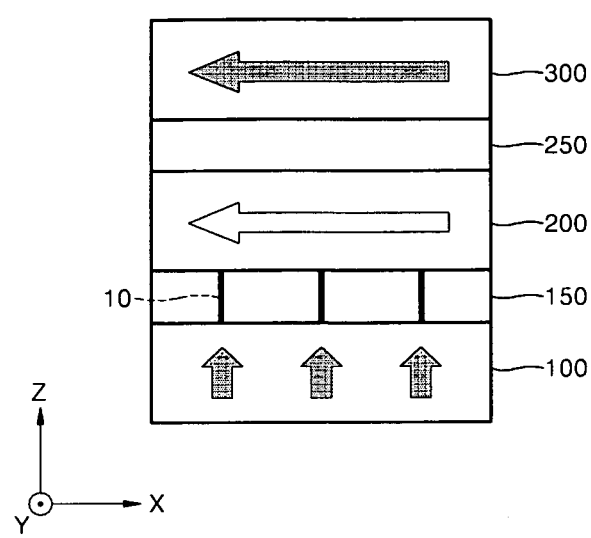
FIG. 7 is a cross-sectional view of an oscillator according to example embodiments.

FIG. 7 is a cross-sectional view of an oscillator according to example embodiments. The oscillator according to example embodiments is modified from the oscillator of FIG. 1.

Referring to FIG. 7, the pinned layer 100 may have perpendicular magnetic anisotropy and the free layer 200 may have in-plane magnetic anisotropy. In this case, a reference layer 300 may further disposed on the free layer 200. A separation layer 250 may be interposed between the free layer 200 and the reference layer 300. The reference layer 300 may be a layer in which a magnetization direction is fixed as in the pinned layer 100. That is, the reference layer 300 may be another pinned layer. Accordingly, the reference layer 300 may be formed of a ferromagnetic material similar to the pinned layer 100. A magnetization direction of the reference layer 300 may not be parallel to the magnetization direction of the pinned layer 100. For example, the magnetization direction of the reference layer 300 may be perpendicular to the magnetization direction of the pinned layer 100. In other words, the reference layer 300 may have in-plane magnetic anisotropy as the free layer 200. In order to generate a signal, the magnetic moment of the free layer 200 may be precessed and then a resistance change between the free layer 200 and the reference layer 300 may be detected. In this regards, more detail descriptions will be provided later with reference to FIG. 8.

The separation layer 250 may be an insulation layer or a conductive layer. The insulation layer may include an oxide (e.g., Mg oxide or Al oxide). The conductive layer may include at least one metal selected from the group consisting of Cu, Al, Au, Ag, Ru, and mixtures thereof, for example. A thickness of the separation layer 250 may be about 10 nm or smaller, for example, about 5 nm or smaller.

Figure 8:
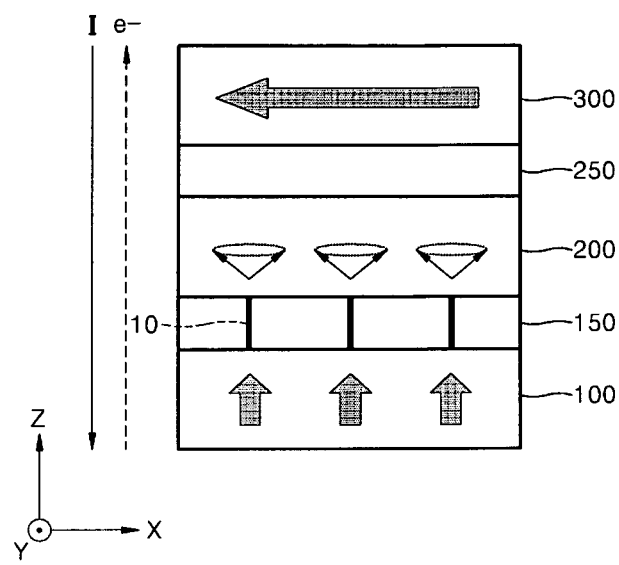
FIG. 8 is a cross-sectional view illustrating a method of operating the oscillator of FIG. 7.

FIG. 8 is a cross-sectional view illustrating a method of operating the oscillator of FIG. 7.

Referring to FIG. 8, a current I for precessing the magnetic moment of the free layer 200 may be applied to the pinned layer 100 from the reference layer 300 through the free layer 200. Electrons e− may flow from the pinned layer 100 to the reference layer 300 through the free layer 200 due to the current I. The electrons e− flowing from the pinned layer 100 to the free layer 200 through the filaments 10 may have the same spin direction as the pinned layer 100 and may apply a spin torque to the free layer 200. Due to the spin torque, the magnetic moment of the free layer 200 may be precessed. In consideration of the orbit of the precession of the magnetic moment in the free layer 200, a resistance change between the pinned layer 100 and the free layer 200 due to the precession may be less. However, a resistance change between the free layer 200 and the reference layer 300 due to the precession may be substantially large. Accordingly, after the precession is induced, a signal in a specific frequency band may be generated from the resistance change between the free layer 200 and the reference layer 300. In FIG. 8, an orbit and direction of precession may vary. In a method of operating the oscillator of FIG. 8, an external magnetic field may be further applied. For example, the external magnetic field may be applied to the free layer 200 in an inverse direction of an X-axis.

Figure 9:
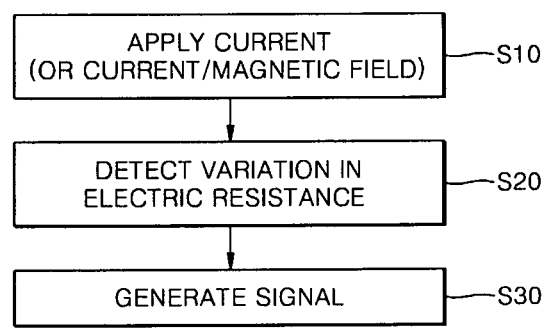
FIG. 9 is a flowchart illustrating a method of operating an oscillator according to example embodiments.

FIG. 9 is a flowchart illustrating a method of operating an oscillator according to example embodiments. FIG. 9 is related to the description of FIGS. 3, 5, 6 and 8.

Referring to FIG. 9, a current or a current/magnetic field is applied to the oscillator so as to precess the magnetic moment of the free layer 200 (S10). While the magnetic moment of the free layer 200 is precessed, an electric resistance change of the oscillator may be detected (S20). The electric resistance of the oscillator may be periodically changed due to the precession. In FIGS. 3, 5 and 6, the electric resistance change of the oscillator may be an electric resistance change between the pinned layer 100 and the free layer 200. In FIG. 8, the electric resistance change of the oscillator may be an electric resistance change between the free layer 200 and the reference layer 300. Due to the electric resistance change of the oscillator, a signal having set frequency may be generated (S30).

The oscillator according to example embodiments may be a frequency tunable oscillator in which oscillation frequency varies according to an operating current condition (the current I of FIGS. 3, 5, 6 and 8). Also, the oscillation frequency of the oscillator according to example embodiments may be adjusted according to thicknesses and materials of layers included in the oscillator.

In addition, when the principle of the oscillator according to example embodiments is reversely applied, a radio frequency (RF) detector that converts a high frequency signal into a direct current (DC) signal may be realized. That is, the structures of FIGS. 1, 2, 4 and 7 may be applied to a RF detector. It is well-known to one of ordinary skill in the art that the RF detector may be realized when the principle of the oscillator is reversely applied, and thus detailed descriptions thereof are omitted.

Figure 10A:
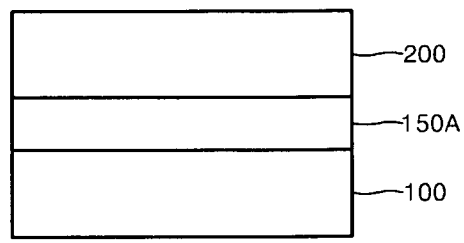
FIGS. 10A and 10B are cross-sectional views illustrating a method of manufacturing an oscillator according to example embodiments.
Figure 10B:
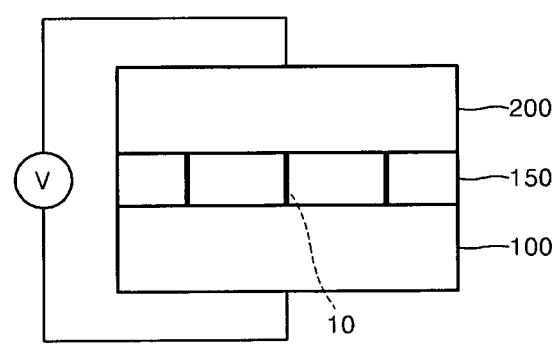

FIGS. 10A and 10B are cross-sectional views illustrating a method of manufacturing an oscillator according to example embodiments.

Referring to FIG. 10A, a stack structure including a pinned layer 100, a free layer 200, and a barrier layer 150A interposed between the pinned layer 100 and the free layer 200 may be formed. The pinned layer 100 and the free layer 200 of FIG. 10A may respectively correspond to the pinned layer 100 and the free layer 200 of FIG. 1. The barrier layer 150A may correspond to the barrier layer 150 of FIG. 1 except that the filaments are not formed therein.

Referring to FIG. 10B, a voltage V may be applied between the pinned layer 100 and the free layer 200 so as to form at least one filament 10 in the barrier layer 150A. The barrier layer 150A in which the filaments 10 are formed is indicated by reference numeral 150. A process of forming the filaments 10 in the barrier layer 150A by applying the voltage V may be referred to as soft breakdown. If the intensity of the voltage V applied between the pinned layer 100 and the free layer 200 is excessively large, electric resistance of the barrier layer 150 may be excessively reduced to an undesired level. Accordingly, appropriate intensity of voltage V may be used to perform the soft breakdown and to form one or more filaments 10 so that resistance of the barrier layer 150 may be reduced to an appropriate level. The appropriate voltage V required in the soft breakdown may vary according to a material and thickness of the barrier layer 150.

In FIG. 10B, the pinned layer 100 may have in-plane magnetic anisotropy and the free layer 200 may have perpendicular magnetic anisotropy (FIG. 2). Alternatively, both the pinned layer 100 and the free layer 200 may have in-plane magnetic anisotropy (FIG. 4). Alternatively, the pinned layer 100 may have perpendicular magnetic anisotropy and the free layer 200 may have in-plane magnetic anisotropy (FIG. 7). When the pinned layer 100 has perpendicular magnetic anisotropy and the free layer 200 has in-plane magnetic anisotropy, the method of manufacturing the oscillator according to example embodiments may further include forming a separation layer (not illustrated) on the free layer 200 and forming a reference layer (not illustrated) on the separation layer. The reference layer may have in-plane magnetic anisotropy.

While the present invention has been particularly shown and described with reference to example embodiments thereof, it will be understood by those of ordinary skill in the art that various changes in form and details may be made therein without departing from the spirit and scope of the present invention as defined by the following claims. The structures of the oscillators of FIGS. 1 through 8 may be modified in various ways, and a method of operating each of the oscillators may be varied in various ways. For example, other material layers may be additionally included between layers constituting the oscillator and/or on at least one of upper surface and lower surface of the oscillator. Also, the method of manufacturing the oscillator illustrated in FIGS. 10A and 10B may vary.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. An oscillator, comprising:
    a pinned layer having a fixed magnetization direction;
    a free layer corresponding to the pinned layer; and
    a barrier layer interposed between the pinned layer and the free layer, the barrier layer including at least one filament,
    wherein the at least one filament connects the pinned layer to the free layer.

2. The oscillator of claim 1, wherein the pinned layer has in-plane magnetic anisotropy, and the free layer has perpendicular magnetic anisotropy.

3. The oscillator of claim 1, wherein the pinned layer and the free layer have in-plane magnetic anisotropy.

4. The oscillator of claim 1, wherein the pinned layer has perpendicular magnetic anisotropy, and the free layer has in-plane magnetic anisotropy.

5. The oscillator of claim 4, further comprising:
    a reference layer corresponding to the free layer; and
    a separation layer interposed between the free layer and the reference layer.

6. The oscillator of claim 5, wherein the reference layer has in-plane magnetic anisotropy.

7. The oscillator of claim 1, wherein the barrier layer has a thickness of about 10 nm or smaller.

8. The oscillator of claim 1, wherein the barrier layer includes a plurality of filaments.

9. A method of manufacturing an oscillator, the method comprising:
    forming a stack structure including a pinned layer, a free layer and a barrier layer interposed between the pinned layer and the free layer; and
    forming at least one filament in the barrier layer by applying a voltage between the pinned layer and the free layer, wherein the at least one filament connects the pinned layer to the free layer.

10. The method of claim 9, wherein the pinned layer has in-plane magnetic anisotropy, and the free layer has perpendicular magnetic anisotropy.

11. The method of claim 9, wherein the pinned layer and the free layer have in-plane magnetic anisotropy.

12. The method of claim 9, wherein the pinned layer has perpendicular magnetic anisotropy, and the free layer has in-plane magnetic anisotropy.

13. The method of claim 12, further comprising:
    forming a reference layer corresponding to the free layer; and forming a separation layer interposed between the free layer and the reference layer.

14. The method of claim 13, wherein the reference layer has in-plane magnetic anisotropy.

15. A method of operating an oscillator including a pinned layer, a free layer and a barrier layer including at least one filament between the pinned layer and the free layer, the at least one filament connecting the pinned layer to the free layer, the method comprising:
- inducing precession of a magnetic moment of at least one region of the free layer that corresponds to the at least one filament; and
- detecting a resistance change of the oscillator due to the precession.

16. The method of claim 15, wherein the inducing of precession of the magnetic moment includes applying a current between the pinned layer and the free layer.

17. The method of claim 16, wherein the current is applied so that electrons flow from the pinned layer to the free layer through the barrier layer.

18. The method of claim 16, wherein the inducing of precession of the magnetic moment further includes applying a magnetic field to the free layer.

19. The method of claim 18, wherein the magnetic field is applied in a direction parallel to a magnetization easy axis of the free layer.

20. The method of claim 15, wherein the pinned layer has in-plane magnetic anisotropy, and the free layer has perpendicular magnetic anisotropy.

21. The method of claim 15, wherein the pinned layer and the free layer have in-plane magnetic anisotropy.

22. The method of claim 15, wherein the pinned layer has perpendicular magnetic anisotropy, and the free layer has in-plane magnetic anisotropy.

23. The method of claim 22, wherein the oscillator further includes a reference layer corresponding to the free layer, and a separation layer interposed between the free layer and the reference layer.

24. The method of claim 23, wherein the reference layer has in-plane magnetic anisotropy.

* * * * *